(12) United States Patent
Jiang et al.

(10) Patent No.: US 11,056,504 B2
(45) Date of Patent: Jul. 6, 2021

(54) MEMORY DEVICE

(71) Applicant: MACRONIX INTERNATIONAL CO., LTD., Hsinchu (TW)

(72) Inventors: Yu-Wei Jiang, Hsinchu (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/661,040

(22) Filed: Oct. 23, 2019

(65) Prior Publication Data

US 2021/0126006 A1    Apr. 29, 2021

(51) Int. Cl.
| | |
|---|---|
| *H01L 27/11582* | (2017.01) |
| *H01L 27/11565* | (2017.01) |
| *H01L 29/45* | (2006.01) |
| *H01L 29/417* | (2006.01) |
| *H01L 29/423* | (2006.01) |
| *H01L 21/28* | (2006.01) |
| *H01L 21/02* | (2006.01) |
| *H01L 21/311* | (2006.01) |
| *H01L 21/306* | (2006.01) |

(52) U.S. Cl.
CPC .... *H01L 27/11582* (2013.01); *H01L 21/0217* (2013.01); *H01L 21/02164* (2013.01); *H01L 21/30604* (2013.01); *H01L 21/31111* (2013.01); *H01L 27/11565* (2013.01); *H01L 29/40117* (2019.08); *H01L 29/41741* (2013.01); *H01L 29/4234* (2013.01); *H01L 29/456* (2013.01)

(58) Field of Classification Search
None
See application file for complete search history.

(56) References Cited

U.S. PATENT DOCUMENTS

| | | |
|---|---|---|
| 9,401,371 B1 | 7/2016 | Lee et al. |
| 10,566,348 B1 | 2/2020 | Yeh et al. |
| 10,644,024 B2 | 5/2020 | Wang |
| 2010/0207194 A1* | 8/2010 | Tanaka .............. H01L 27/11582 257/324 |
| 2014/0035023 A1 | 2/2014 | Ahn |
| 2016/0099254 A1* | 4/2016 | Park .................... G11C 16/0483 257/324 |
| 2017/0062456 A1* | 3/2017 | Sugino ................ H01L 27/1157 |
| 2017/0200715 A1* | 7/2017 | Sekar ................ H01L 21/76254 |
| 2019/0067312 A1* | 2/2019 | Arisumi ............ H01L 27/11565 |
| 2019/0123060 A1* | 4/2019 | Wang .................. H01L 27/1157 |

FOREIGN PATENT DOCUMENTS

| | | |
|---|---|---|
| TW | 201712912 A | 4/2017 |
| TW | 201917829 A | 5/2019 |
| TW | I670838 B | 9/2019 |

OTHER PUBLICATIONS

Office Action dated Jun. 30, 2020 in Taiwan application (No. 108138306).

* cited by examiner

Primary Examiner — Michelle Mandala
Assistant Examiner — Jordan M Klein
(74) Attorney, Agent, or Firm — McClure, Qualey & Rodack, LLP

(57) ABSTRACT

A memory device includes a channel element, a memory element, and an electrode element. The channel element has an open ring shape. A memory cell is defined in the memory element between the channel element and the electrode element.

17 Claims, 21 Drawing Sheets

MEMORY DEVICE

BACKGROUND

Technical Field

The disclosure relates to a memory device.

Description of the Related Art

As critical dimensions of devices in integrated circuits shrink toward perceived limits of manufacturing technologies, designers have been looking to techniques to achieve greater storage capacity, and to achieve lower costs per bit.

SUMMARY

The present disclosure relates to a memory device.

According to an embodiment, a memory device is provided. The memory device comprises a channel element, a memory element, and an electrode element. The channel element has an open ring shape. A memory cell is defined in the memory element between the channel element and the electrode element.

According to another embodiment, a memory device is provided. The memory device comprises a channel element, a memory element, and an electrode element. The memory element has an open ring shape, A memory cell is defined in the memory element between the channel element and the electrode element.

According to yet another embodiment, a memory device is provided. The memory device comprises a memory element, a source side element, a drain side element, a channel element, an insulating element, and an electrode element. The channel element is electrically connected between the source side element and the drain side element. The channel element and the source side element and the drain side element are on opposing sides of the insulating element respectively, A memory cell is defined in the memory element between the channel element and the electrode element.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements details of the embodiments could be modified or changed according to the actual needs of the practical applications. The disclosure is not limited to the descriptions of the embodiments. The illustration uses the same/similar symbols to indicate the same/similar elements.

Figure 1:
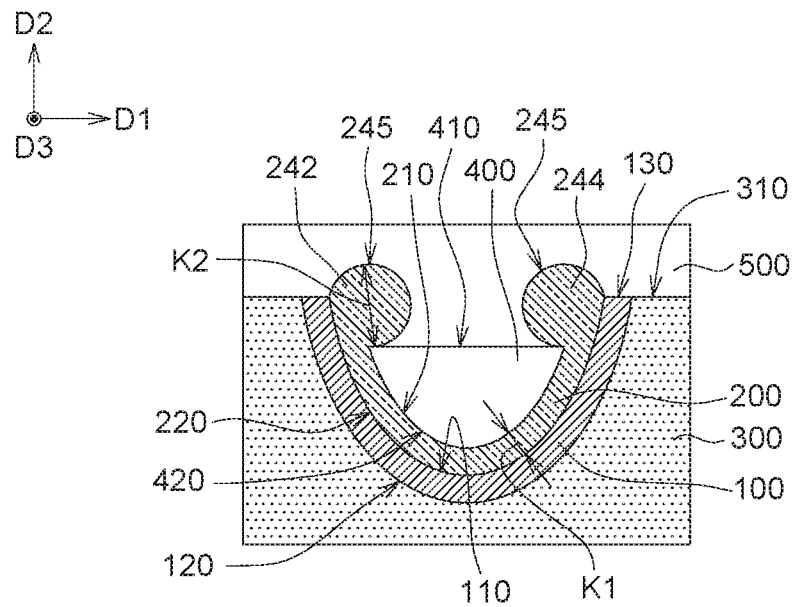
FIG. 1 is a cross-section view of a memory device of an embodiment.

Referring to FIG. 1, a cross-section view of a memory device of an embodiment is shown. The memory device comprises a memory element 100, a channel element 200 and an electrode element 300.

The memory element 100 has an open ring shape. The memory element 100 comprises a concave curved sidewall memory surface 110, a convex curved sidewall memory surface 120, and a sidewall memory plane 130. The sidewall memory plane 130 is between the concave curved sidewall memory surface 110 and the convex curved sidewall memory surface 120.

The channel element 200 has an open ring shape. The channel element 200 has a concave curved sidewall channel surface 210 and a convex curved sidewall channel surface 220 opposing to the concave curved sidewall channel surface 210. The channel element 200 is electrically connected between a source side element 242 and a drain side element 244. The channel element 200 may comprise the source side element 242 and the drain side element 244. The source side element 242 and the drain side element 244 have convex curved sidewall surfaces 245 opposing to the convex curved sidewall channel surface 220 of the channel element 200. The channel element 200 may be among the source side element 242, the drain side element 244 and the memory element 100. In an embodiment, the channel element 200 is on the concave curved sidewall memory surface 110 of the memory element 100, and the source side element 242 and the drain side element 244 are extended from opposing ends of the channel element 200 respectively, and beyond the sidewall memory plane 130 of the memory element 100.

In embodiments, the channel element 200 has a size K1 smaller than a size K2 of the source side element 242 and the drain side element 244. The size K1 of the channel element 200 may be a size (such as a thickness) defined between the concave curved sidewall channel surface 210 and the convex curved sidewall channel surface 220. The size K2 of the source side element 242 and the drain side element 244 may be the maximum gap between opposing points on the convex curved sidewall surface 245.

The channel element 200, the source side element 242 and the drain side element 244 may comprise a semiconductor material, such as polysilicon, single crystal silicon, etc. A dopant concentration of the source side element 242 and the drain side element 244 may be different from a dopant concentration of the channel element 200. The source side element 242 and the drain side element 244 may have a conductivity larger than a conductivity of the channel element 200. The dopant concentration of the source side element 242 and the drain side element 244 may be higher than the dopant concentration of the channel element 200. For example, the source side element 242 and the drain side element 244 may comprise a N-type heavily doped semiconductor material (such as single crystal silicon or polysilicon, and so on), and the channel element 200 may comprise an un-doped or N-type lightly doped semiconductor material (such as single crystal silicon or polysilicon, and so on). However, the present disclosure is not limited thereto.

The electrode element 300 has a sidewall electrode surface 310. The sidewall electrode surface 310 of the electrode element 300 is coplanar with the sidewall memory plane 130 of the memory element 100. The electrode element 300 is on the convex curved sidewall memory surface 120 of the memory element 100.

The channel element 200 and the source side element 242 and the drain side element 244 are on opposing sides of an insulating element 400 respectively. The insulating element 400 has a plane sidewall insulating surface 410 and a convex curved sidewall insulating surface 420 adjacent to the plane sidewall insulating surface 410. The convex curved sidewall insulating surface 420 may be opposing to the plane sidewall insulating surface 410. The channel element 200 may be adjoined with the convex curved sidewall insulating surface 420. The source side element 242 and the drain side element 244 are extended from the channel element 200 and beyond the plane sidewall insulating surface 410. The source side element 242 and the drain side element 244 may be on the plane sidewall insulating surface 410.

An insulating layer 500 is adjacent to the source side element 242 and the drain side element 244. The insulating element 400 is between the insulating layer 500 and the channel element 200. Specifically, the insulating layer 500 may be on the sidewall electrode surface 310 of the electrode element 300, the sidewall memory plane 130 of the memory element 100, the convex curved sidewall surface 245 of the source side element 242 and the drain side element 244 and the plane sidewall insulating surface 410 of the insulating element 400.

In this embodiment, the plane sidewall insulating surface 410 of the insulating element 400 is not aligned with the sidewall memory plane 130 of the memory element 100, and is not aligned with the sidewall electrode surface 310 of the electrode element 300.

In embodiments, a metal silicide layer (not shown) may be disposed on a sidewall surface of the source side element 242 and the drain side element 244 opposing to the channel element 200. Specifically, the metal silicide layer may be disposed on the convex curved sidewall surfaces 245 of the source side element 242 and the drain side element 244 not in contact with the insulating element 400 and the channel element 200.

In an embodiment, the source side element 242 and the drain side element 244 are functioned as a source electrode and a drain electrode respectively. The electrode element 300 is functioned as a gate electrode, such as a word line. A memory cell is defined in the memory element 100 between the channel element 200 and the electrode element 300.

Figure 14:
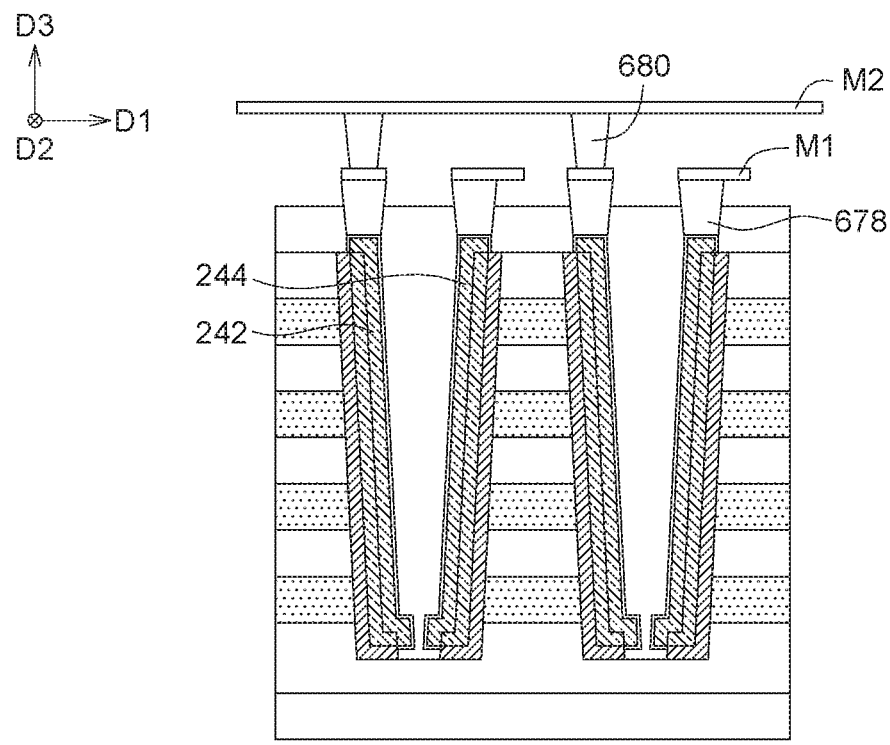

Arrangement profile of the channel element 200 (which may comprise the source side element 242 and the drain side element 244) and the memory element 100 according to FIG. 1 can form a memory component of a decreased unit size. Therefore, a memory cell array density of the memory device can be increased. The source side element 242 and the drain side element 244 have a size larger than a size of the channel element 200. Therefore, an alignment of a manufacturing step for forming an upper conductive element (such as a first conductive via 678 as shown in FIG. 14) and a condition of electrical connection between the source side element 242 and the drain side element 244 and the upper conductive element can be improved. Process window and product yield are increased.

In an embodiment, FIG. 1 may be a cross-section view of the memory device in a plane of a first direction D1 and a second direction D2. The first direction D1 is different from the second direction D2. In an embodiment, the first direction D1 is perpendicular to the second direction D2 substantially. For example, the first direction D1 is the X direction, and the second direction D2 is the Y direction.

Figure 2:
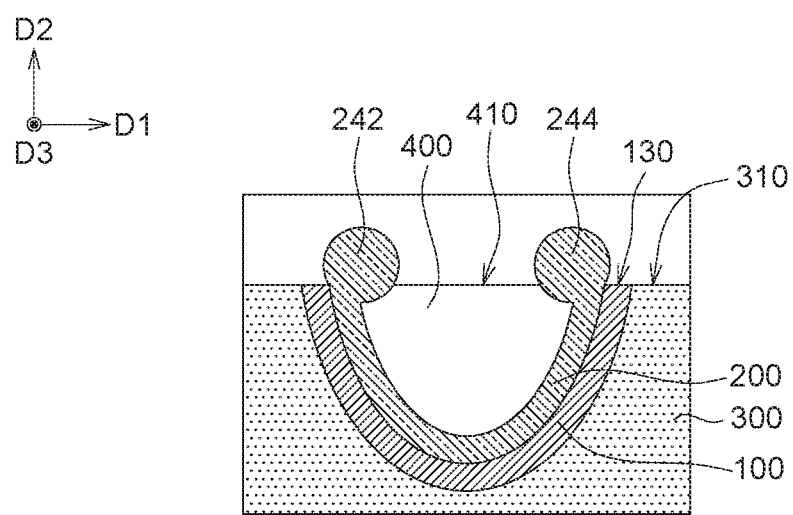
FIG. 2 is a cross-section view of a memory device of another embodiment.

Referring to FIG. 2, a cross-section view of the memory device of another embodiment is shown. In this embodiment, the plane sidewall insulating surface 410 of the insulating element 400 may be substantially aligned with the sidewall memory plane 130 of the memory element 100, and aligned with the sidewall electrode surface 310 of the electrode element 300. Arrangement profile of the channel element 200, the source side element 242, the drain side element 244 and the memory element 100 according to FIG. 2 can form a memory component of a decreased unit size. Therefore, a memory cell array density of the memory device can be increased. The source side element 242 and the drain side element 244 have a size larger than a size of the channel element 200. Therefore, an alignment of a manufacturing step for forming an upper conductive element (such as the first conductive via 678 as shown in FIG. 14) and a condition of electrical connection between the source side element 242 and the drain side element 244 and the upper conductive element can be improved. Process window and product yield are increased.

FIG. 3A to FIG. 14 are used to illustrate a method for manufacturing the memory device according to embodiments.

Figure 3A:
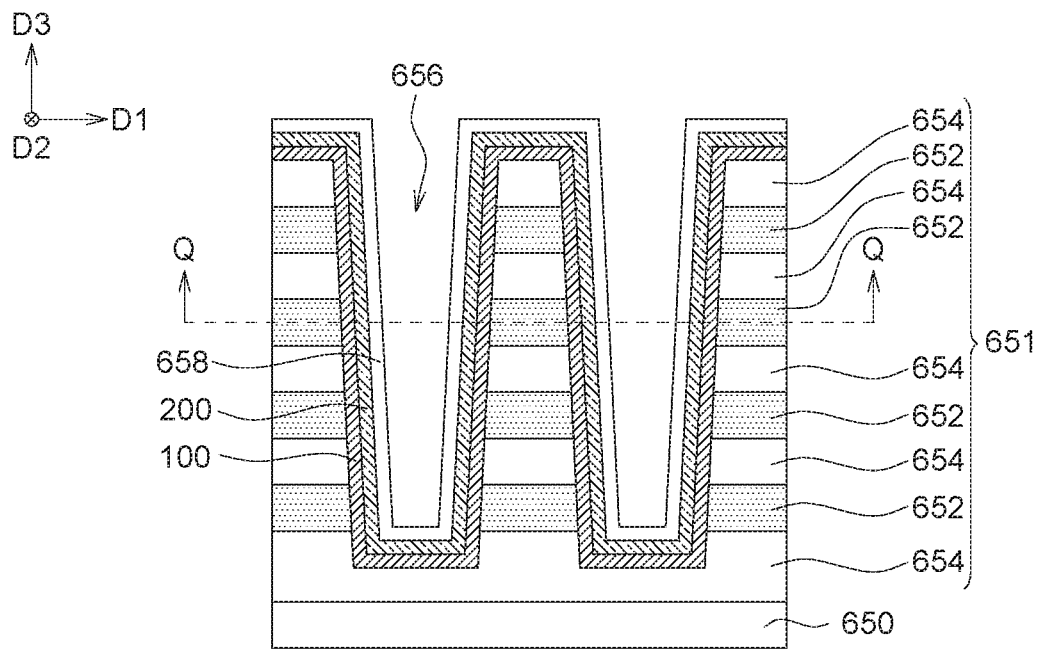
FIG. 3A to FIG. 14 illustrate a method for manufacturing a memory device according to embodiments.
Figure 3B:
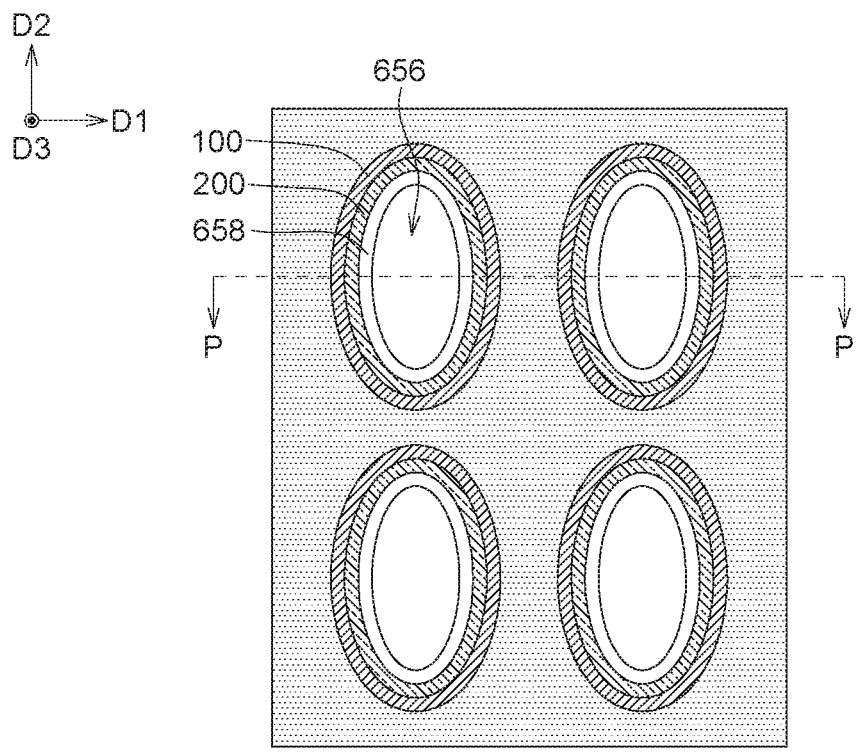

FIG. 3A and FIG. 3B are referred to. FIG. 3A is a longitudinal cross-section view of the memory device, which may be drawn along a P-P line shown in FIG. 3B. FIG. 3B is a lateral cross-section view of the memory device, which may be drawn along a Q-Q line shown in FIG. 3A. A stacked structure 651 may be formed on a substrate 650. The stacked structure 651 comprises material films 652 and insulating films 654 stacked alternately on the substrate 650. The material film 652 has a material different from a material of the insulating film 654. In an embodiment, the material film 652 comprises a nitride such as silicon nitride. The insulating film 654 comprises an oxide such as silicon oxide. However, the present disclosure is not limited thereto. The insulating film 654 may use other suitable insulating materials. The material film 652 may use other suitable materials such as a dielectric material or a conductive material. An opening 656 may be formed in the stacked structure 651 by using a photolithography etching technique.

The memory element 100 may be formed in the opening 656 and on an upper surface of the stacked structure 651. The memory element 100 may comprise any kind of charge trapping structure, such as an ONO structure, or BE-SONGS structure, etc. For example, a charge trapping layer may use a nitride such as silicon nitride, or other high-K materials comprising a metal oxide such as $Al_2O_3$, $HfO_2$, and so on. The channel element 200 may be formed on the memory element 100. The channel element 200 may comprise an un-doped or doped semiconductor material such as polysilicon, single crystal silicon and so on. An insulating material film 658 may be formed on the channel element 200. In an embodiment, the insulating material film 658 may comprise an oxide such as silicon oxide. However, the present disclosure is not limited thereto. The insulating material film 658 may comprise a nitride such as silicon nitride, or other suitable insulating materials.

Figure 4A:
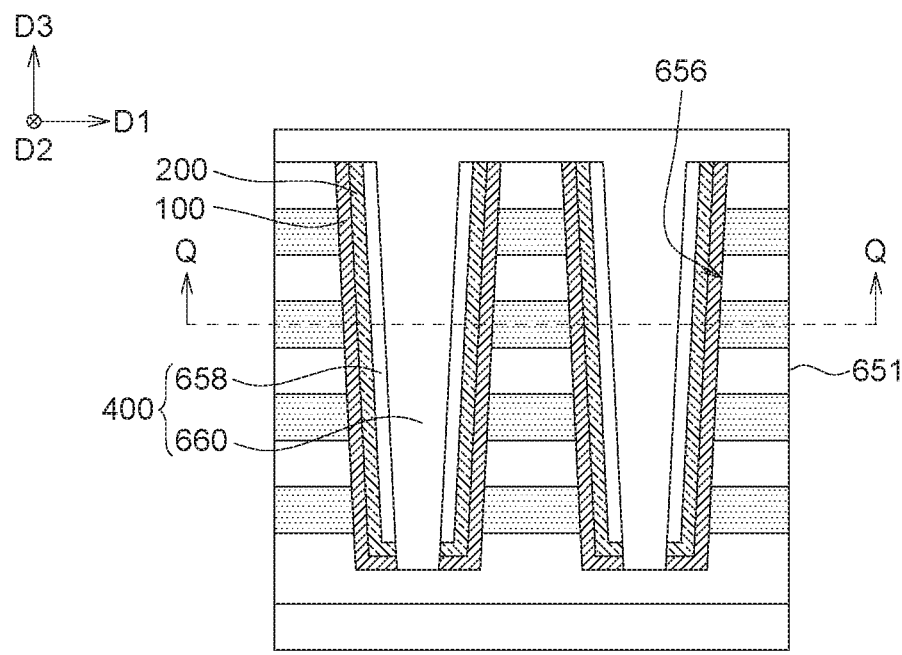
Figure 4B:
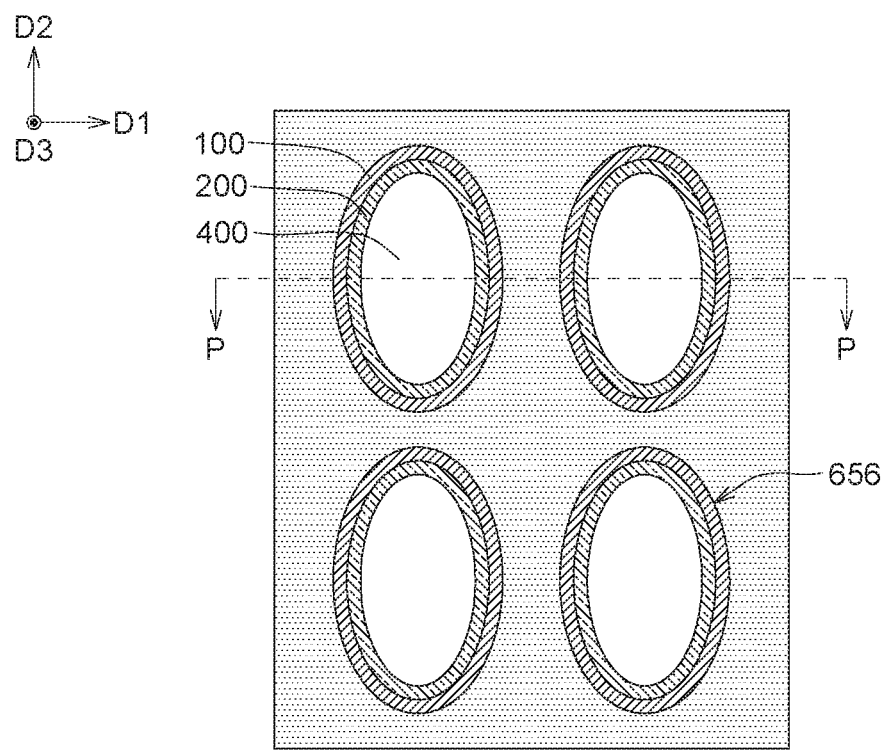

FIG. 4A and FIG. 4B are referred ta. FIG. 4A is a longitudinal cross-section view of the memory device, which may be drawn along the P-P line shown in FIG. 4B. FIG. 4B is a lateral cross-section view of the memory device, which may be drawn along the Q-Q line shown in FIG. 4A. An etching back step may be performed to remove a portion of the memory element 100, the channel element 200 and the insulating material film 658 on the upper surface of the stacked structure 651, and on a bottom portion of the opening 656. In an embodiment, an anisotropic etching step may be performed to remove a portion of the insulating material film 658 on the upper surface of the stacked structure 651, and on the bottom portion of the opening 656, remaining another portion of the insulating material film 658 on a sidewall surface of the channel element 200, and then another etching step may be performed to remove a portion of the channel element 200 and the memory element 100 not covered by the insulating material film 658. An insulating material layer 660 may be formed filling the opening 656 and on the upper surface of the stacked structure 651. In an embodiment, the insulating material layer 660 may comprise an oxide such as silicon oxide. However, the present disclosure is not limited thereto. The insulating material layer 660 may comprise a nitride such as silicon nitride, or other suitable insulating materials. The insulating element 400 may comprise the insulating material film 658 and the insulating material layer 660.

Figure 5A:
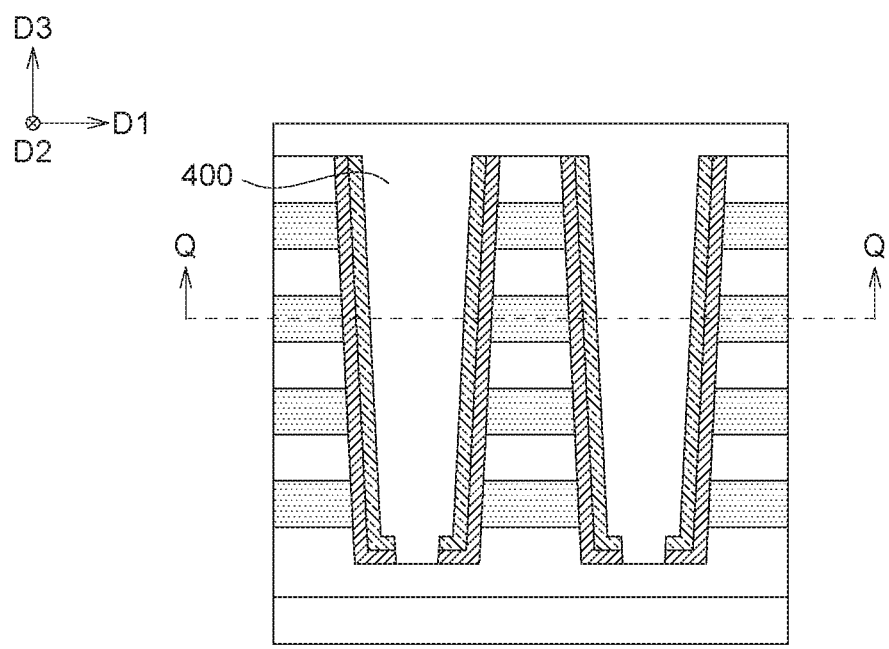
Figure 5B:
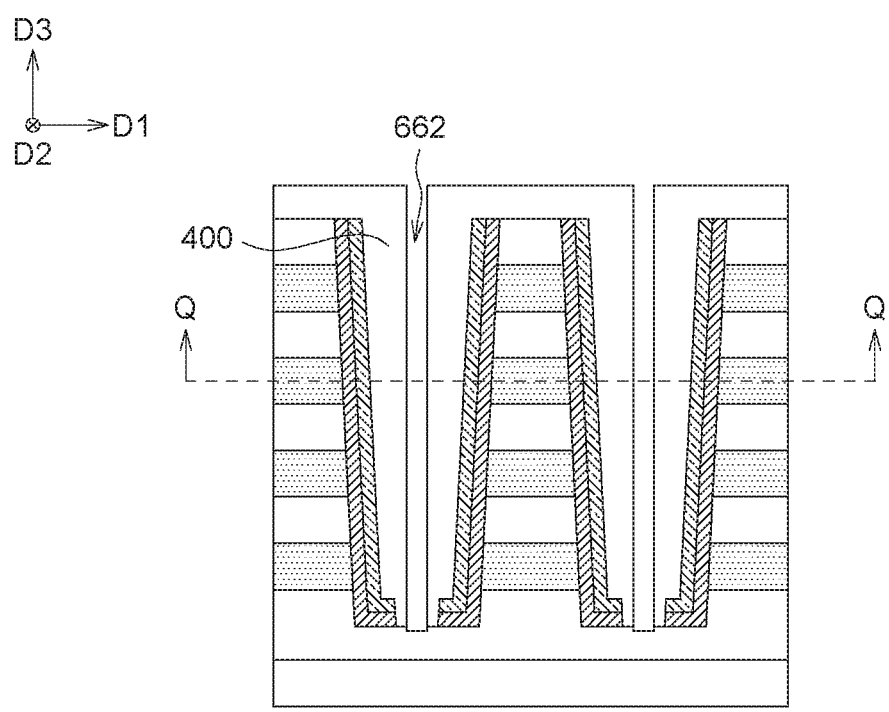
Figure 5C:
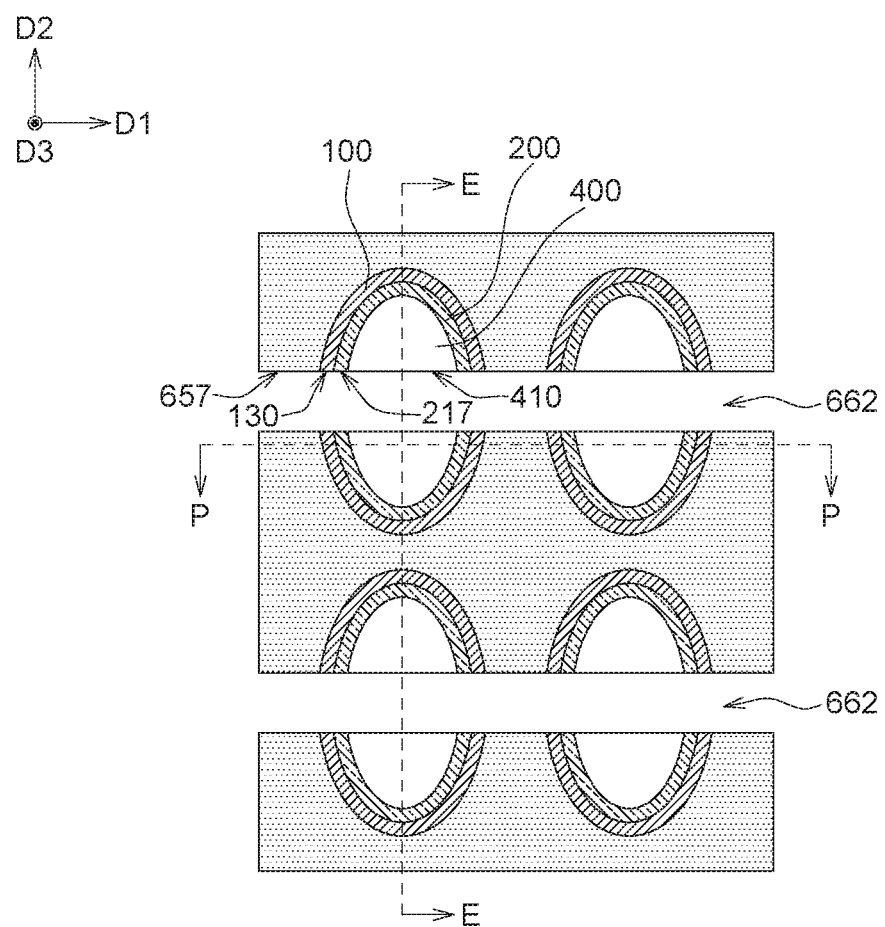

As shown in FIG. 4B, the insulating element 400 may have a solid circle shape. The channel element 200 may have a close ring shape or a hollow circle shape, surrounding the insulating element 400. The memory element 100 may have a close ring shape or a hollow circle shape, surrounding the channel element 200. In an embodiment, a trench 662 may be formed in the structure shown in FIG. 4A and FIG. 4B to form a structure shown in FIG. 5A, FIG. 5B and FIG. 5C. FIG. 5A and FIG. 5B are longitudinal cross-section views of the memory device. FIG. 5A may be drawn along the P-P line shown in FIG. 5C. FIG. 5B may be drawn along a E-E line shown in FIG. 5C. FIG. 5C is a lateral cross-section view of the memory device, which may be drawn along the Q-Q line shown in FIG. 5A and FIG. 5B.

As shown in FIG. 5C, the insulating element 400 is patterned as a solid semi-circle shape by the trench 662. The channel element 200 is patterned as an open ring shape by the trench 662. The memory element 100 is patterned as an open ring shape by the trench 662. The plane sidewall insulating surface 410 of the insulating element 400, a sidewall channel surface 217 of the channel element 200, the sidewall memory plane 130 of the memory element 100, and a sidewall surface 657 of the material film 652 are a co-plane.

Figure 6A:
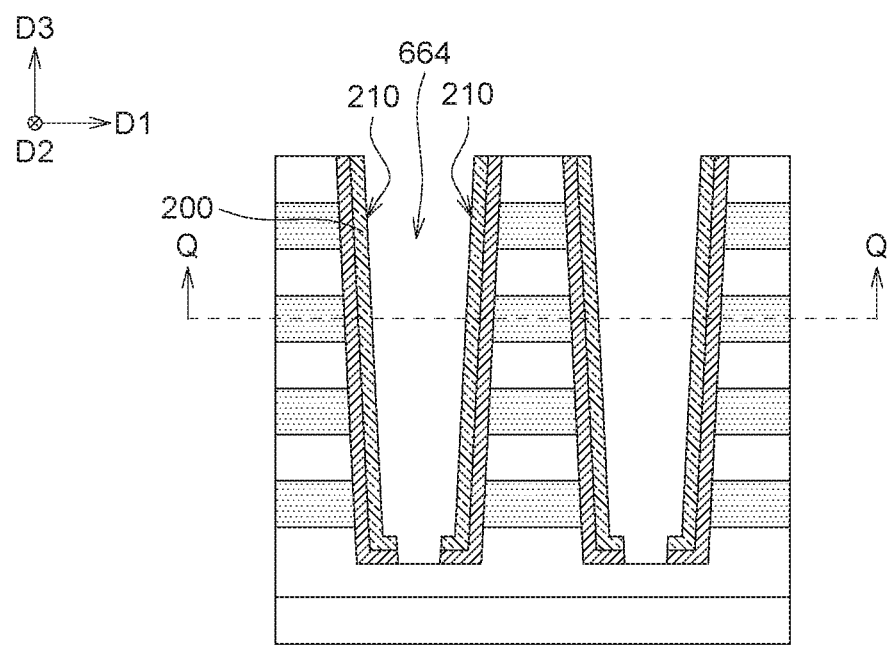
Figure 6B:
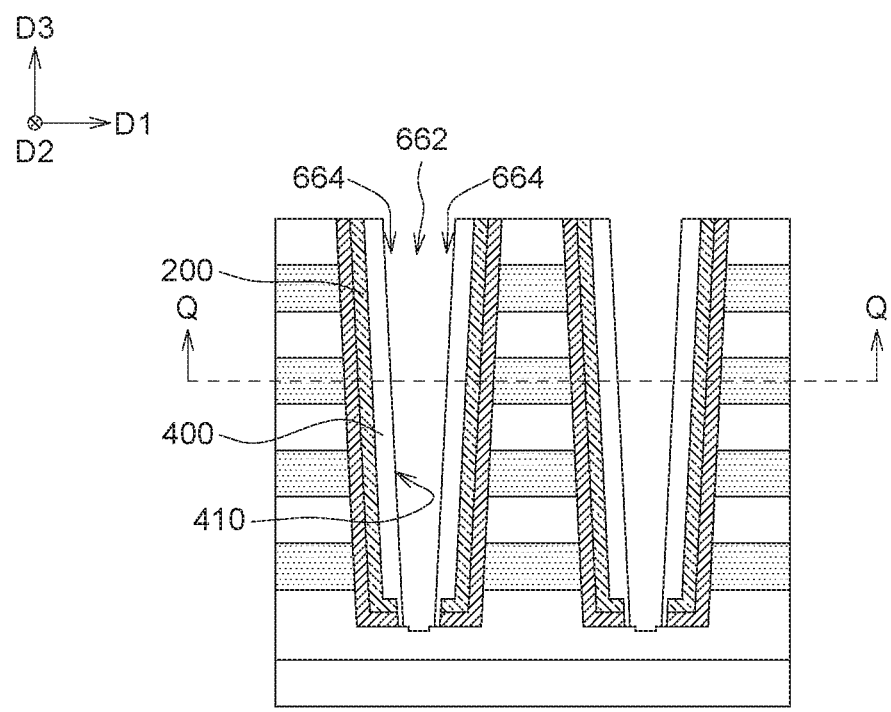
Figure 6C:
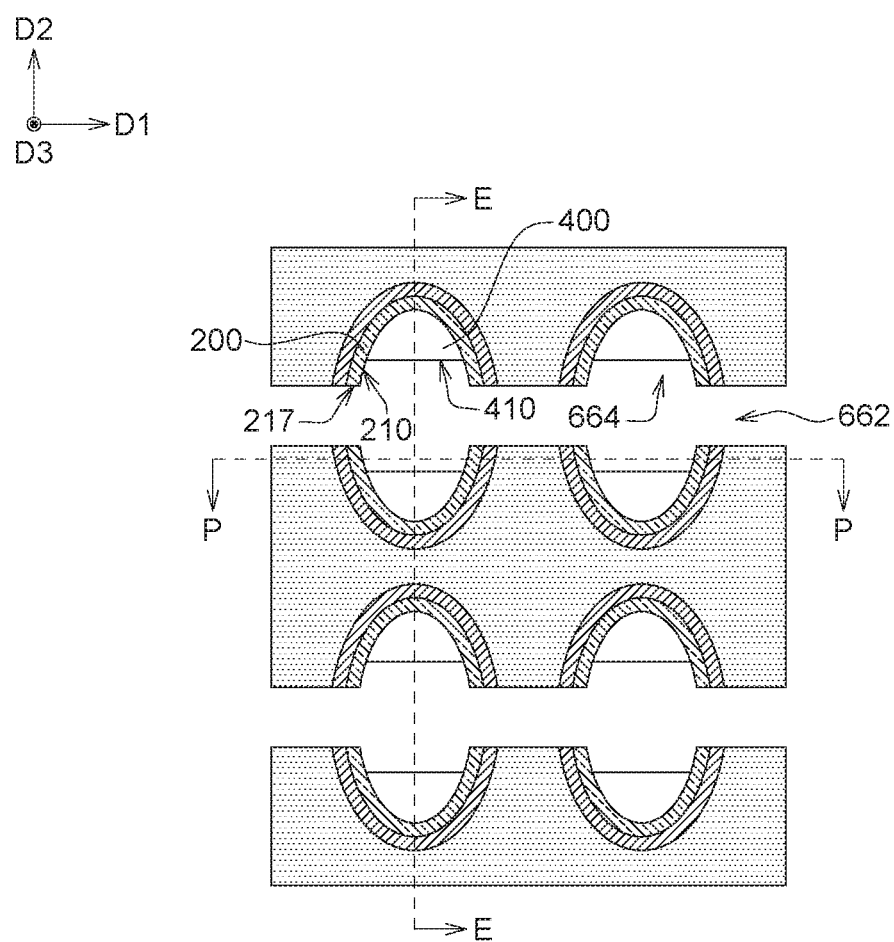
Figure 7A:
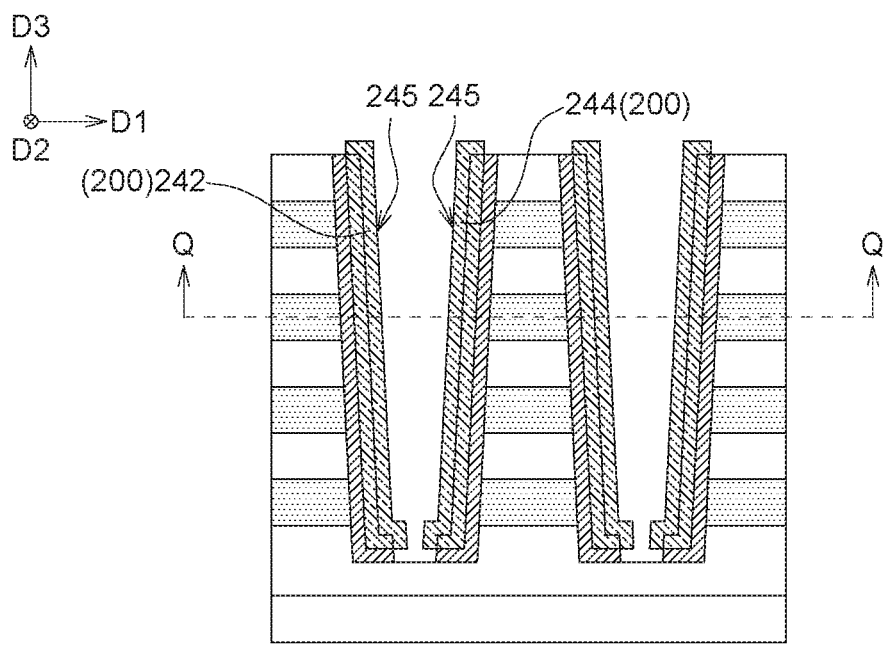
Figure 7B:
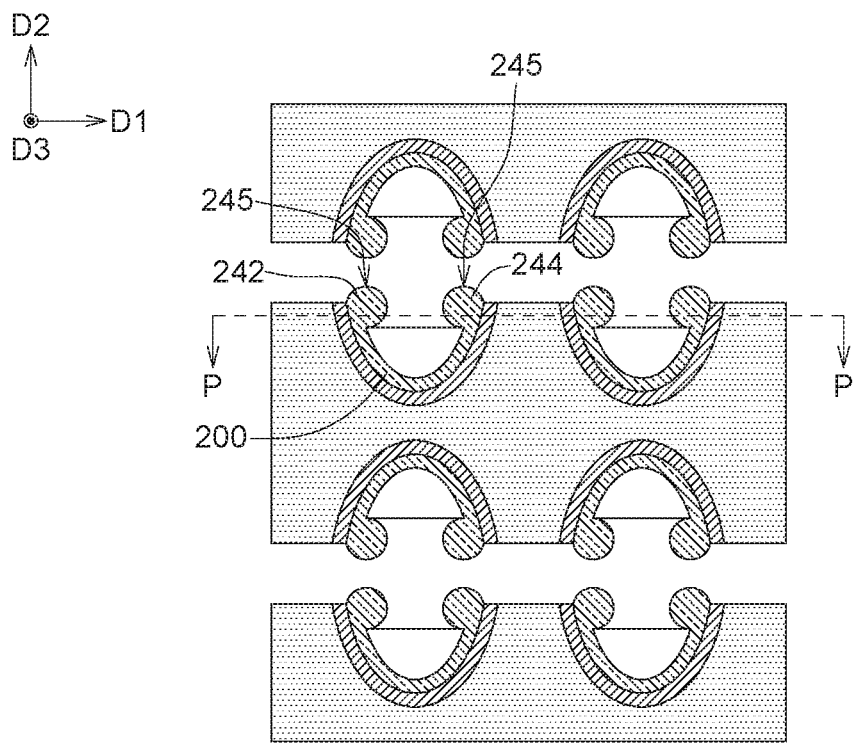

FIG. 6A, FIG. 6B and FIG. 60 are referred to. FIG. 6A and FIG. 6B are longitudinal cross-section views of the memory device. FIG. 6A may be drawn along the P-P line shown in FIG. 6C. FIG. 6B may be drawn along the E-E line shown in FIG. 6C. FIG. 6C is a lateral cross-section view of the memory device, which may be drawn along the Q-Q line shown in FIG. 6A and FIG. 6B. The plane sidewall insulating surface 410 may be shifted towards an inner direction of the insulating element 400 by performing an etching back step from the plane sidewall insulating surface 410 of the insulating element 400 exposed by the trench 662 so as to form a recess 664. The recess 664 exposes the concave curved sidewall channel surface 210 of the channel element 200. Then, the source side element 242 and the drain side element 244 may be formed on the surface (comprising the concave curved sidewall channel surface 210 and the sidewall channel surface 217) of the channel element 200 exposed by the recess 664 and the trench 662 by a deposition method, as shown in FIG. 7A and FIG. 7B. FIG. 7A is a longitudinal cross-section view of the memory device, which may be drawn along the P-P line shown in FIG. 7B. FIG. 7B is a lateral cross-section view of the memory device, which may be drawn along the Q-Q line shown in FIG. 7A. In an embodiment, the source side element 242 and the drain side element 244 are formed by an epitaxial growth from the channel element 200, and therefore have the convex curved sidewall surfaces 245.

Figure 8A:
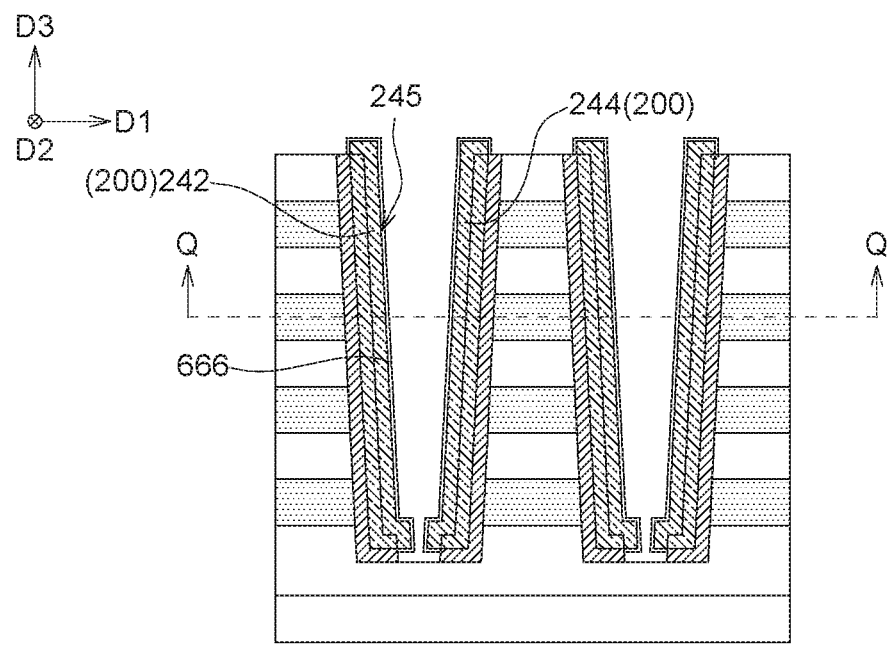
Figure 8B:
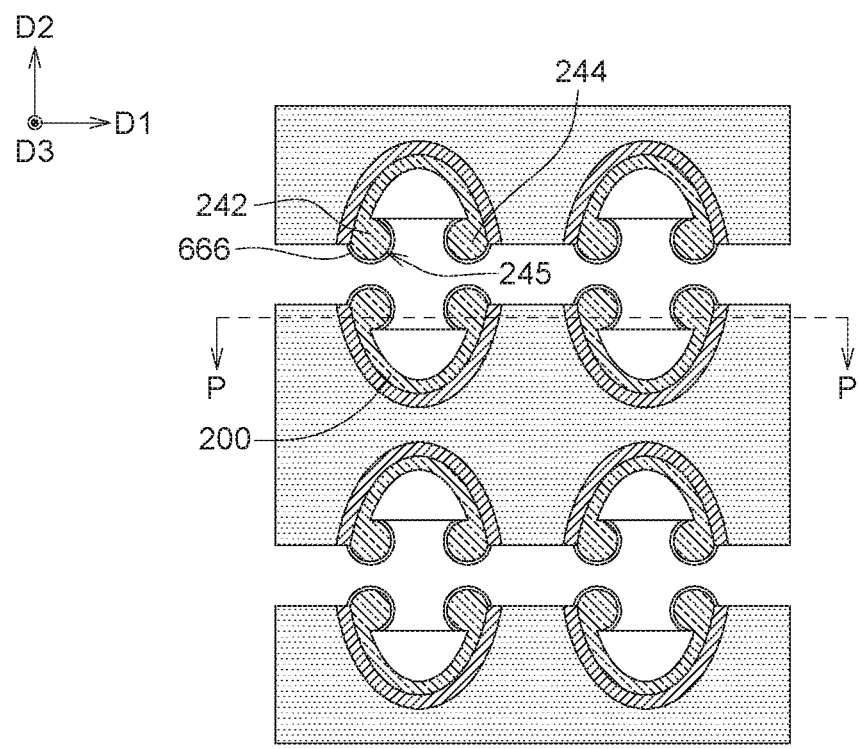
Figure 9A:
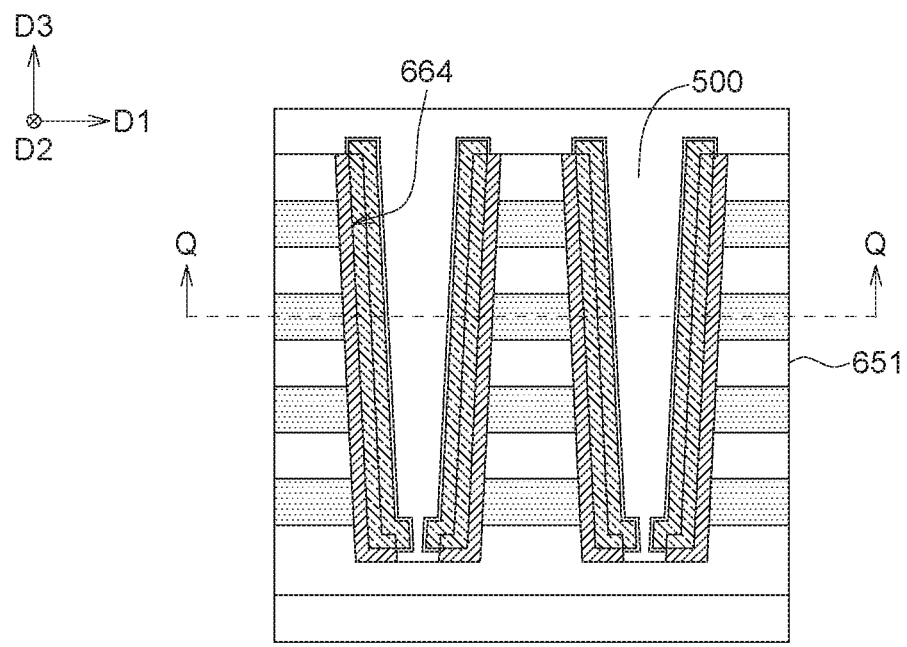
Figure 9B:
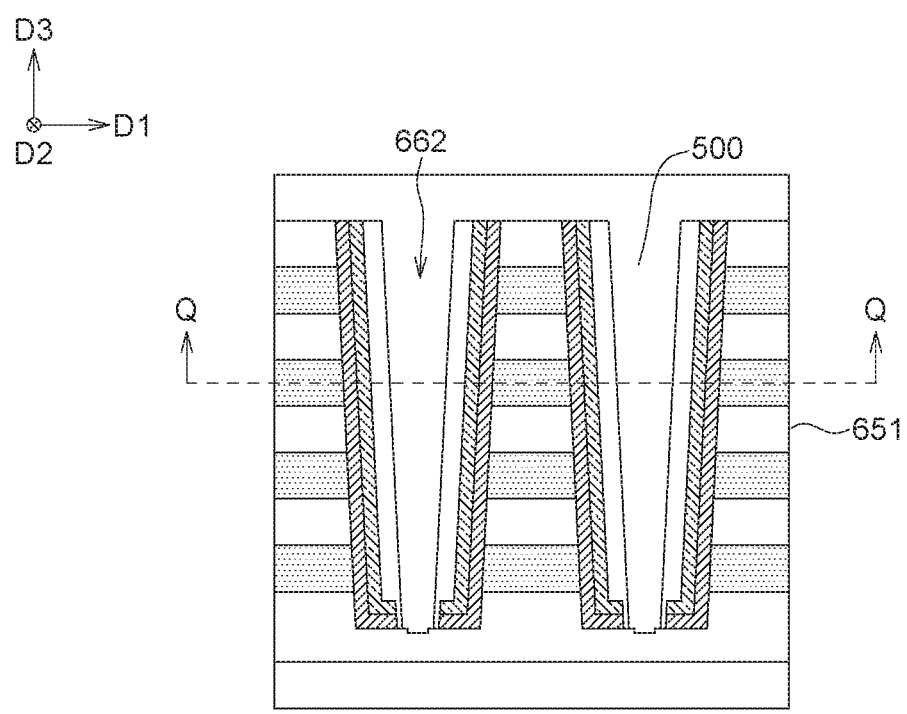
Figure 9C:
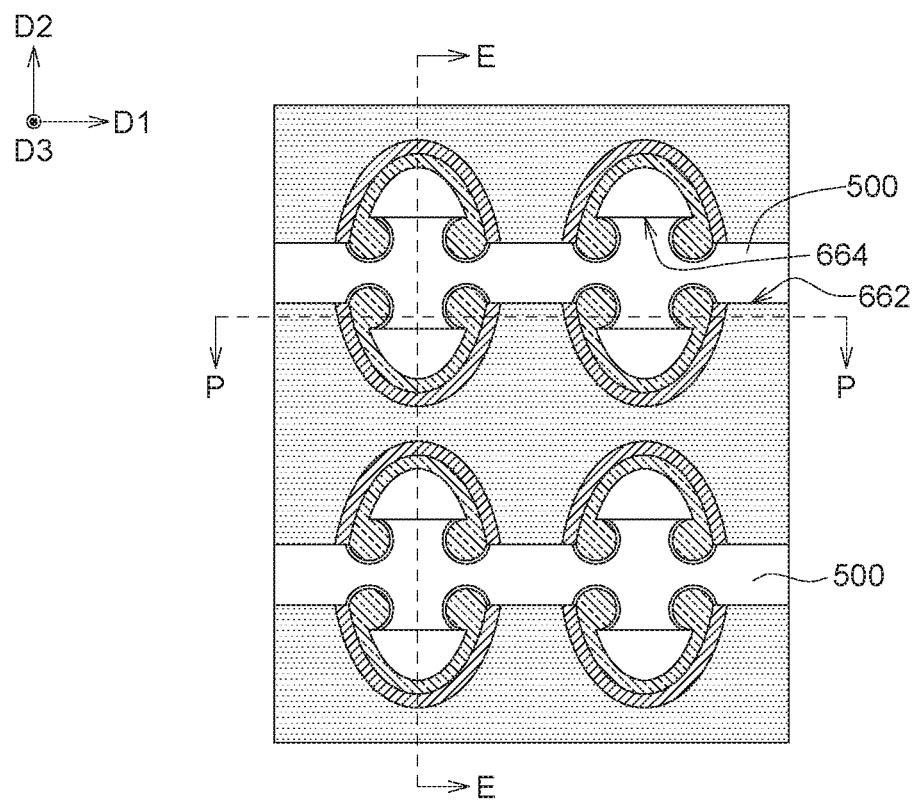

FIG. 8A and FIG. 8B are referred to. FIG. 8A is a longitudinal cross-section view of the memory device, which may be drawn along the P-P line shown in FIG. 8B. FIG. 8B is a lateral cross-section view of the memory device, which may be drawn along the Q-Q line shown in FIG. 8A. A metal silicide layer 666 may be formed on the exposed surface (comprising the convex curved sidewall surface 245) of the source side element 242 and the drain side element 244. The metal silicide layer 666 may comprise NiSi, PtSi, TiSi2, WSi2, CoSi2 and so on, FIG. 9A, FIG. 9B and FIG. 9C are referred to. FIG. 9A and FIG. 9B are longitudinal cross-section views of the memory device. FIG. 9A may be drawn along the P-P line shown in FIG. 9C. FIG. 9B may be drawn along the E-E line shown in FIG. 9C. FIG. 9C is a lateral cross-section view of the memory device, which may be drawn along the Q-Q line shown in FIG. 9A and FIG. 9B. The insulating layer 500 may be formed filling the recess 664 and the trench 662, and on the upper surface of the stacked structure 651. The insulating layer 500 may comprise an oxide such as silicon oxide, a nitride such as silicon nitride, or other suitable insulating materials.

Figure 10A:
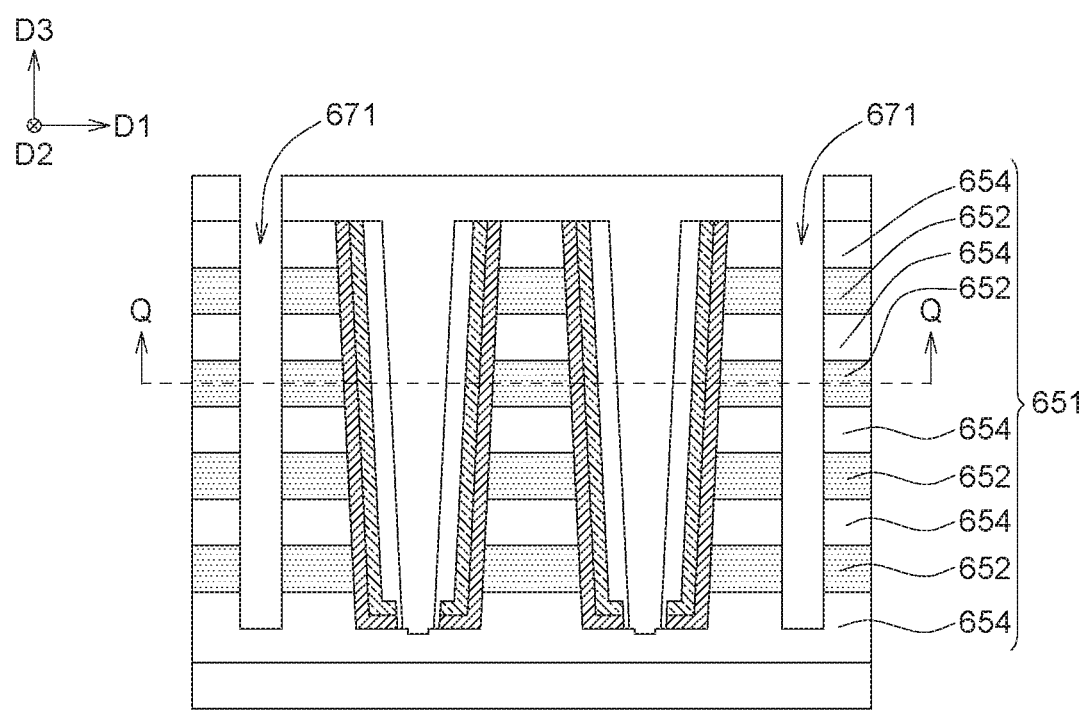
Figure 10B:
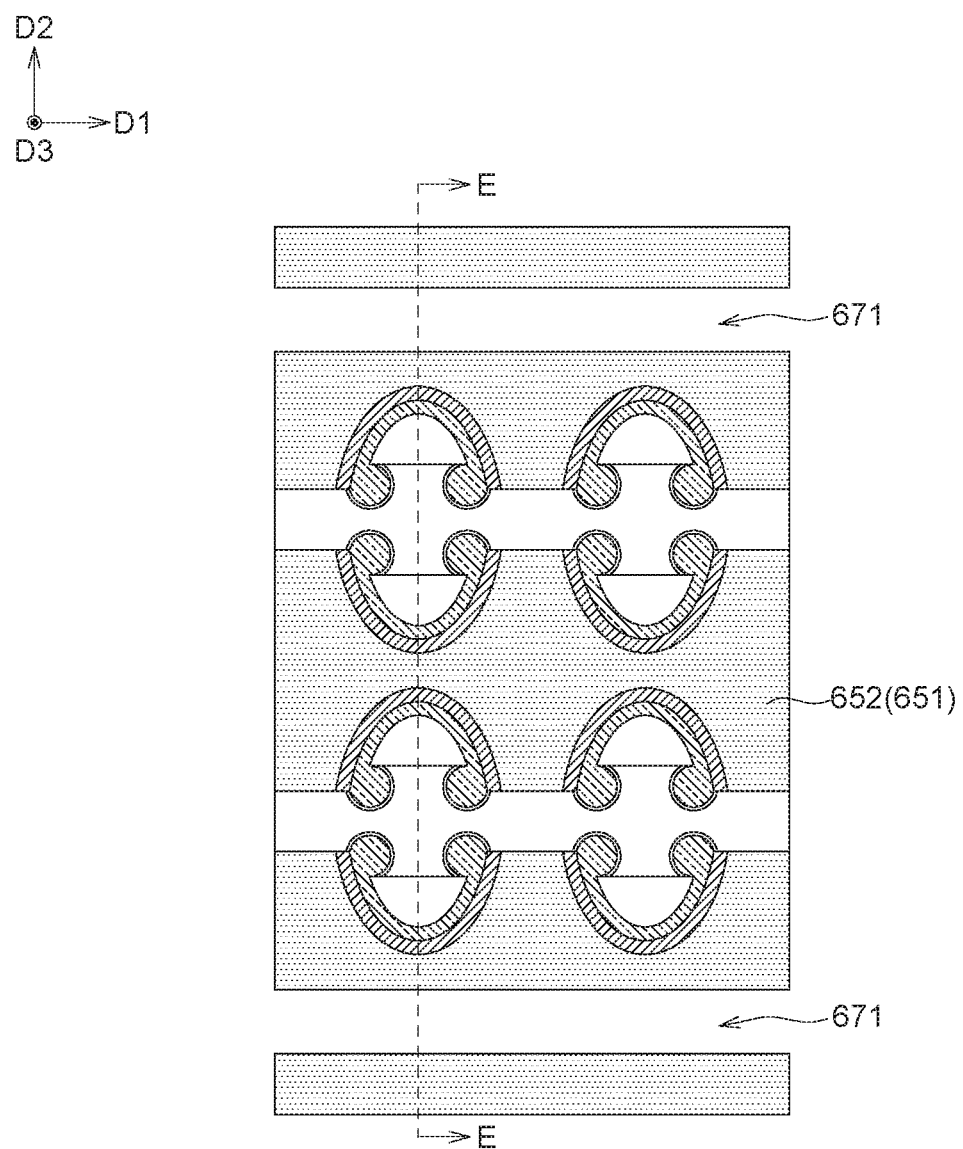
Figure 11A:
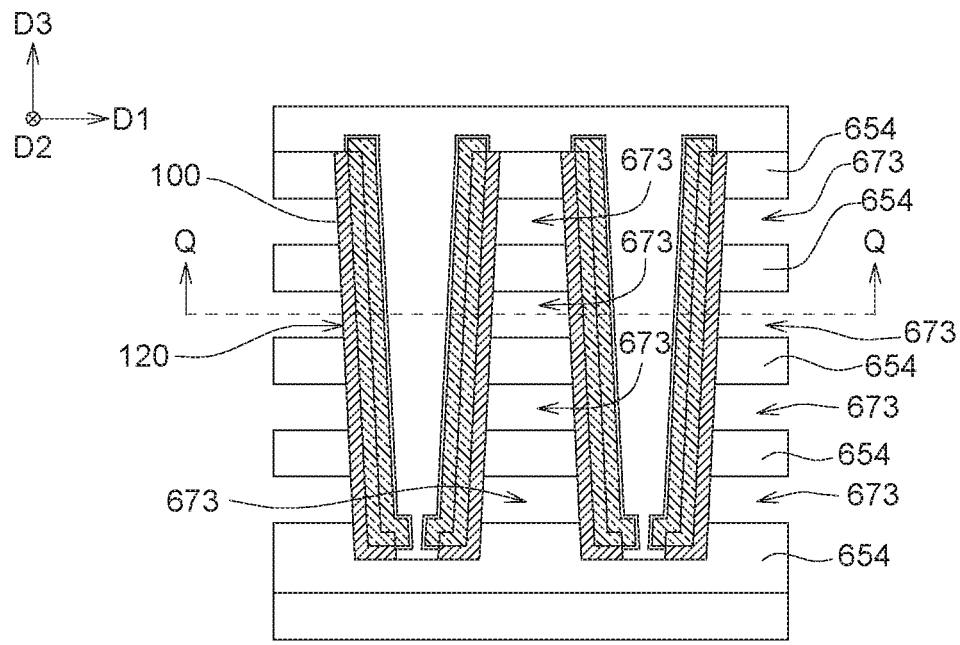
Figure 11B:
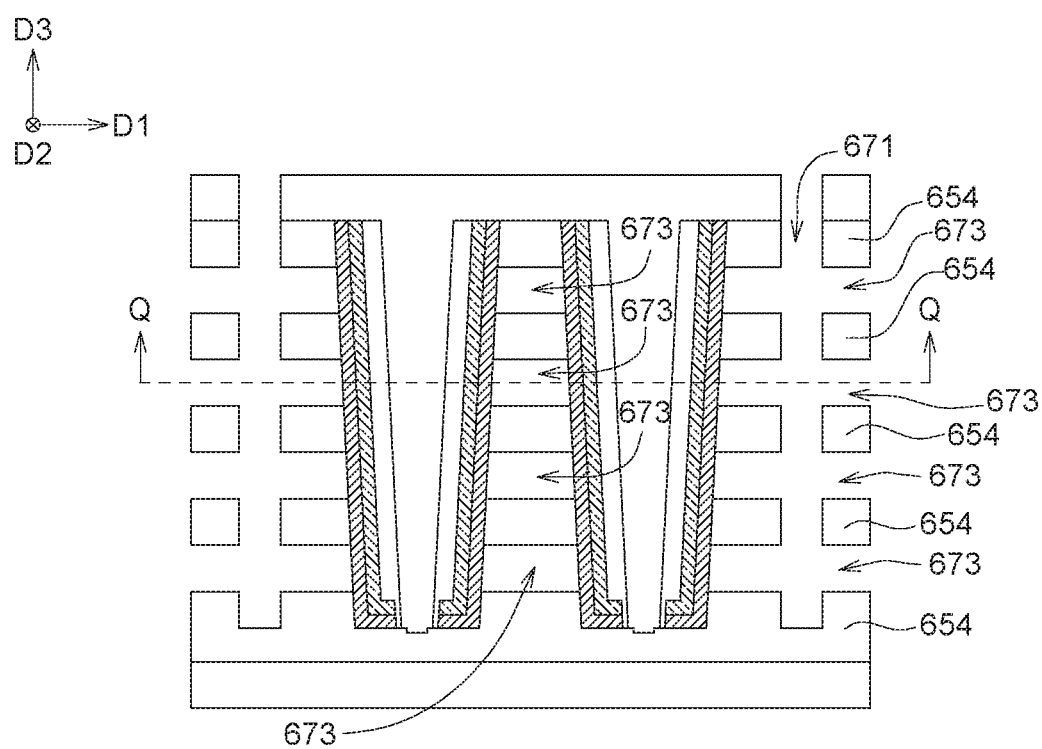
Figure 11C:
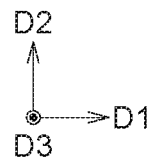
Figure 11C:
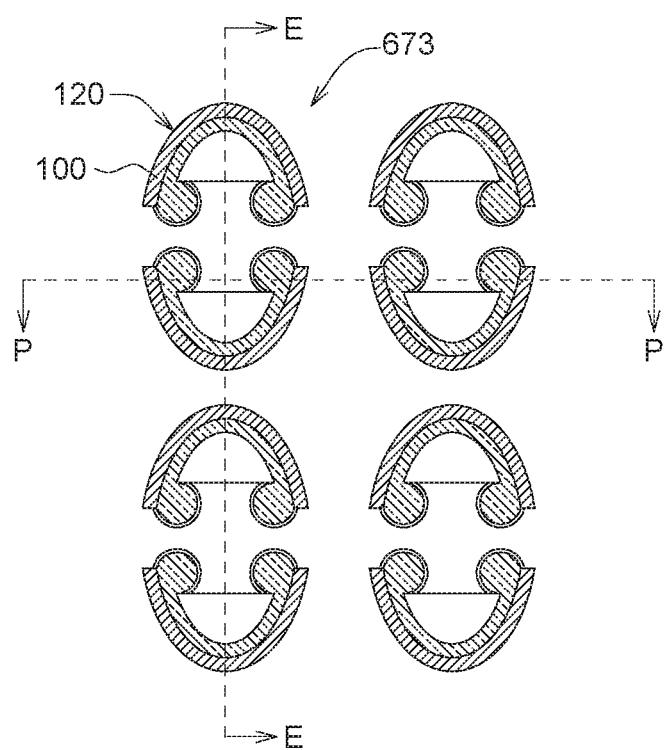

FIG. 10A and FIG. 10B are referred to. FIG. 10A is a longitudinal cross-section view of the memory device, which may be drawn along the E-E line shown in FIG. 10B. FIG. 10B is a lateral cross-section view of the memory device, which may be drawn along the Q-Q line shown in FIG. 10A. A trench 671 may be formed in the stacked structure 651 by using a photolithography etching process. The sidewall surfaces of the insulating film 654 and the material film 652 of the stacked structure 651. The material film 652 (i.e. as a sacrificial layer) exposed by the trench 671 may be removed by an etching step to form a slit 673 as shown in FIG. 11A, FIG. 11B and FIG. 110. FIG. 11A and FIG. 11B are longitudinal cross-section views of the memory device. FIG. 11A may be drawn along the P-P line shown in FIG. 11C. FIG. 11B may be drawn along the E-E line shown in FIG. 11C. FIG. 11C is a lateral cross-section view of the memory device, which may be drawn along the Q-Q line shown in FIG. 11A and FIG. 11B, The slit 673 may expose the convex curved sidewall memory surface 120 of the memory element 100, and an upper surface/a lower surface of the insulating film 654.

Figure 12A:
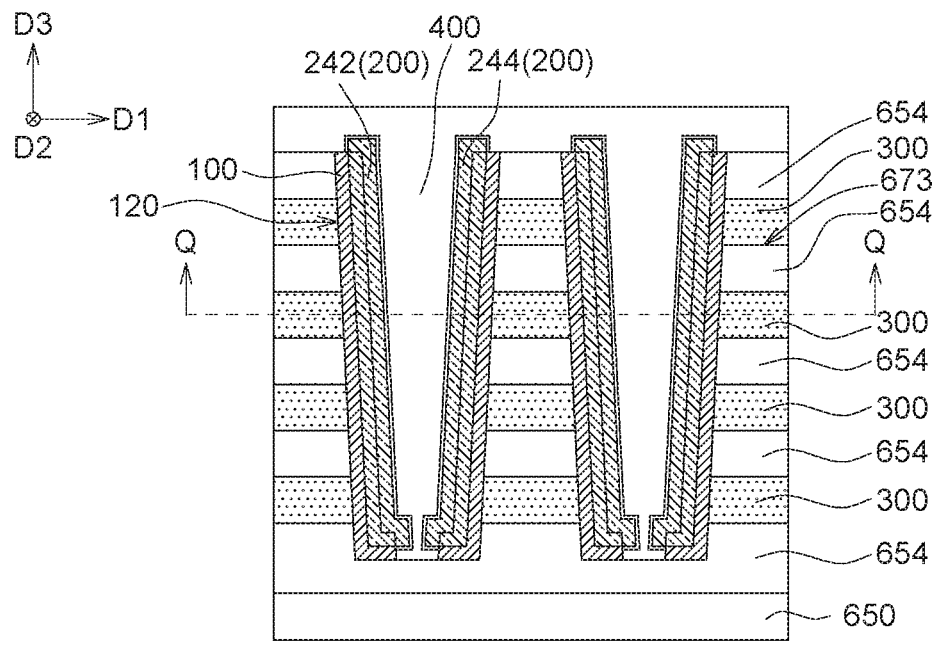
Figure 12B:
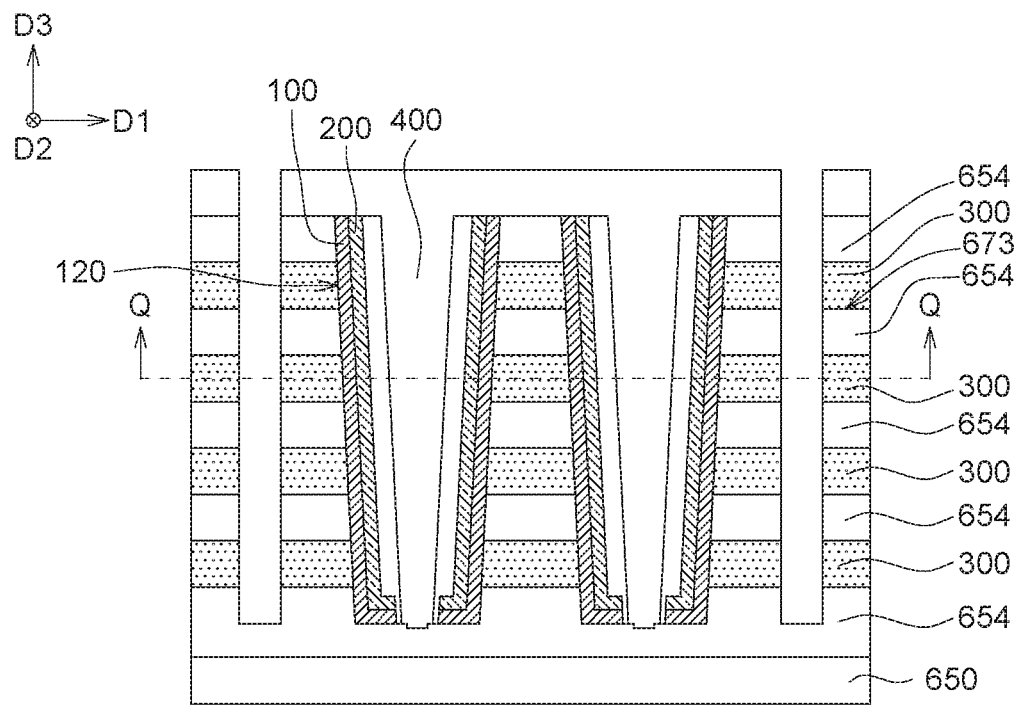
Figure 12C:
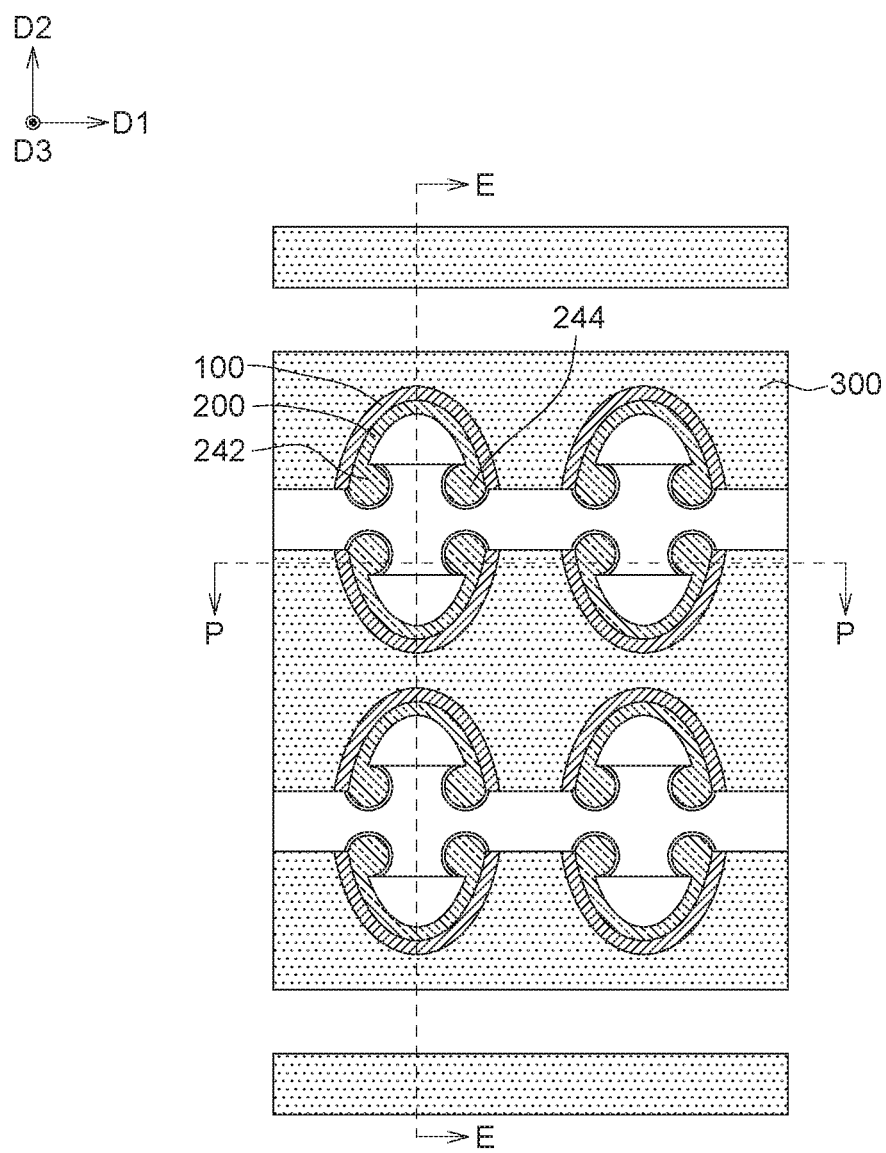

FIG. 12A, FIG. 12B and FIG. 120 are referred to. FIG. 12A and FIG. 12B are longitudinal cross-section views of the memory device. FIG. 12A may be drawn along the P-P line shown in FIG. 12C. FIG. 12B may be drawn along the E-E line shown in FIG. 120. FIG. 120 is a lateral cross-section view of the memory device, which may be drawn along the Q-Q line shown in FIG. 12A and FIG. 12B. The electrode element 300 may be formed in the slit 673. The electrode element 300 may comprise a metal such as W and so on. The electrode element 300 may also comprise a barrier layer having a conductor property, and the metal layer may be formed on the barrier layer. For example, the barrier layer may comprise TaN, TiN and so on. In an embodiment, a dielectric film may be formed before the electrode element 300, and the electrode element 300 may be formed on the dielectric film. The dielectric film may comprise a high-K material, for example, comprising a metal oxide such as $Al_2O_3$, $HfO_2$, and so on, or other suitable dielectric materials. The electrode elements 300 are disposed on the sidewall memory surface (i.e. the convex curved sidewall memory surface 120) of the memory element 100, and separated from each other by the insulating films 654 along the third direction D3. The third direction D3 is different from the first direction D1 and the second direction D2. In an embodiment, the third direction D3 may be substantially perpendicular to the first direction D1 and the second direction D2. The third direction D3 may be the Z direction, such as a direction vertical to the upper surface of the substrate 650.

In an embodiment, the structure composing a memory cell may be similar to the structure described with referring to FIG. 1, In embodiments, the electrode elements 300 are gate electrode elements. The electrode elements 300 can be functioned as word lines. The memory cells are defined in the memory element 100 between the channel element 200 and the electrode elements 300. The memory cells of different levels in the third direction D3 are electrically connected in parallel between the source side element 242 and the drain side element 244. The memory device may comprise an AND-type memory device. The memory deceive may be formed with a self-aligning technique in manufacturing method according to embodiments. The manufacturing method is simple, and cost can be reduced.

Figure 13A:
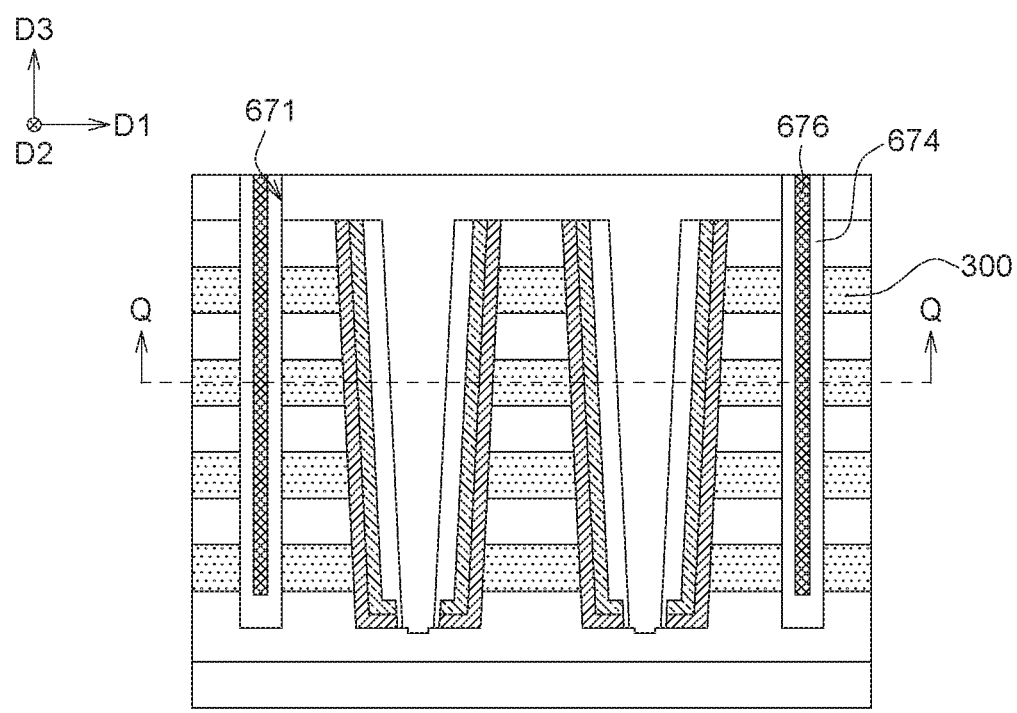
Figure 13B:
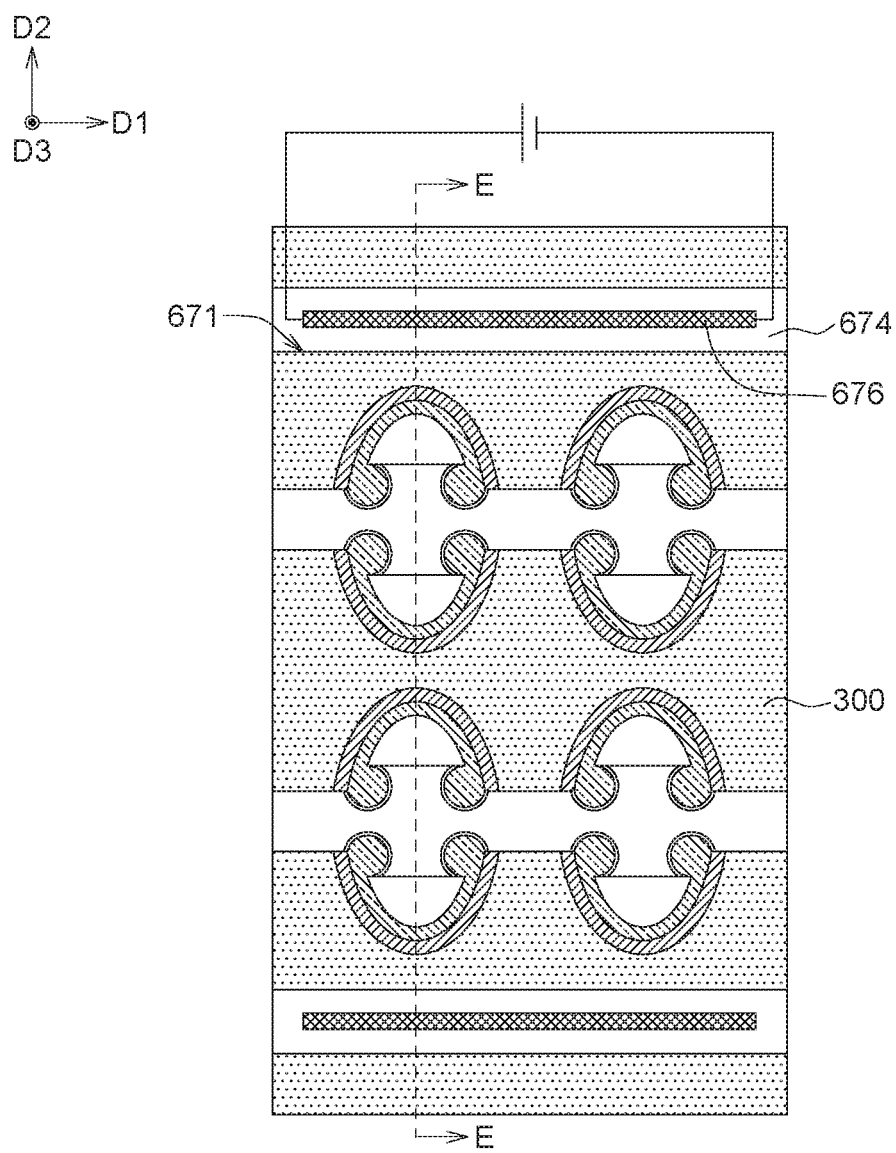

FIG. 13A and FIG. 13B are referred to. FIG. 13A is a longitudinal cross-section view of the memory device, which may be drawn along the E-E line shown in FIG. 13B. FIG. 13B is a lateral cross-section view of the memory device, which may be drawn along the Q-Q line shown in FIG. 13A. An insulating film 674 may be formed in the trench 671. The insulating film 674 may comprise an oxide such as silicon oxide, or a nitride such as silicon nitride, or other suitable insulating materials. The insulating film 674 may be formed by a PVD method, a CVD method, or other suitable deposition methods. A material element 676 may be formed on the insulating film 674, and filling the trench 671. In an embodiment, the material element 676 is a conductive element, which may be electrically insulated from the electrode element 300 in the stacked structure by the insulating film 674. In this case, a voltage bias may be applied to the material element 676 to inject a current so as to perform a joule heating to the memory cell. By which, performance such as endurance and data retention of the memory cell may be improved. In another embodiment, the material element 676 is an insulating material, for example comprising an oxide such as silicon oxide, etc., and can be functioned as a bypass element together with the insulating film 674.

FIG. 14 is referred to, which shows a longitudinal cross-section view of the memory device. The first conductive via 678 may be formed on the source side element 242 and the drain side element 244. A first metal layer M1 may be formed on the first conductive via 678. A second conductive via 680 may be formed on the first metal layer M1. A second metal layer M2 may be formed on the second conductive via 680.

Figure 15:
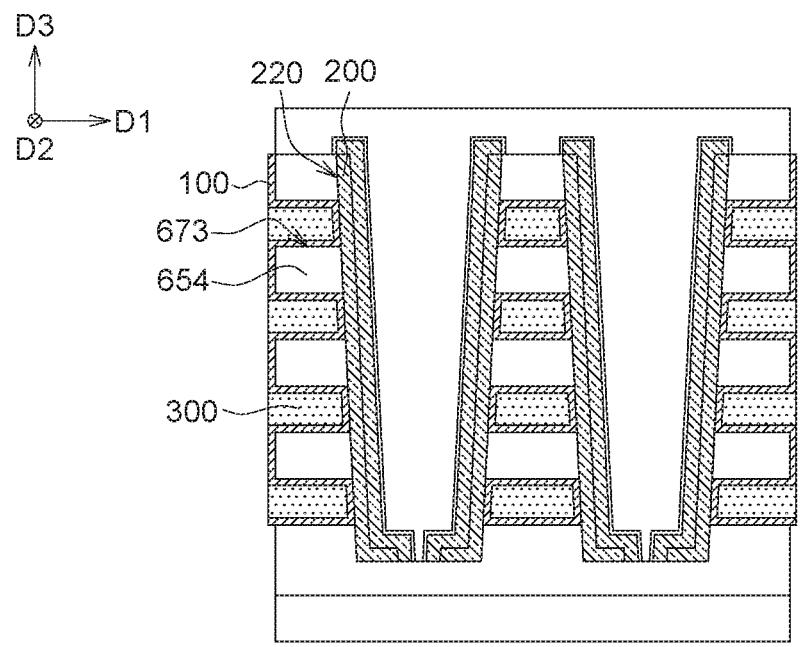
FIG. 15 illustrates a cross-section view of a memory device according to embodiments.

In another embodiment, the process relating to the forming the memory element 100 with referring to FIG. 3A and FIG. 3B may be omitted, and after the process relating to the forming the slit 673 with referring to FIG. 11A, FIG. 11B and FIG. 11C, the memory element 100 may be formed on the convex curved sidewall channel surface 220 of the channel element 200 and the surface of the insulating film 654 exposed by slit 673. Then, the process relating to the forming the electrode element 300 in the slit 673 with referring to FIG. 12A, FIG. 12B and FIG. 12C may be performed. Through the modification, the memory device as shown in FIG. 15 may be formed, wherein the memory element 100 is on an upper electrode surface, a lower electrode surface, and a sidewall electrode surface of the electrode element 300.

In an embodiment, the process relating to the etching back of the insulating element 400/the forming the recess 664 with referring to FIG. 6A, FIG. 6B and FIG. 6C may be omitted. Through the modification, the memory device as shown in FIG. 2 may be formed.

Figure 16:
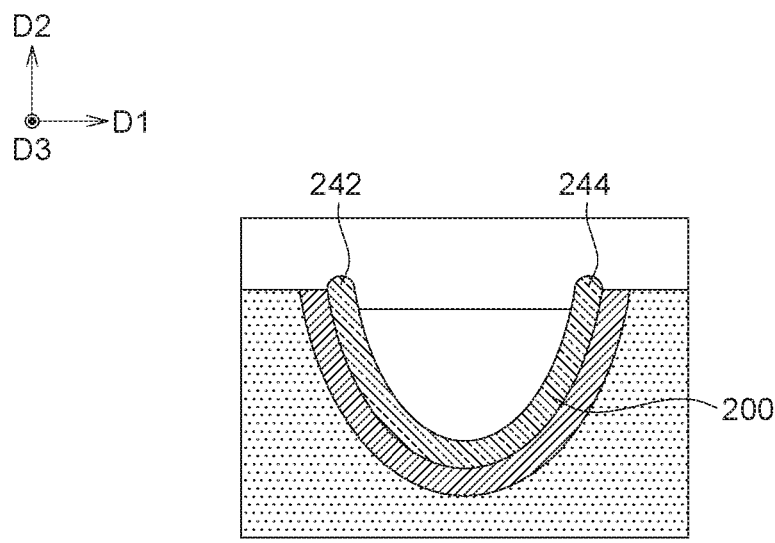
FIG. 16 illustrates a cross-section view of a memory device according to embodiments.
Figure 17:
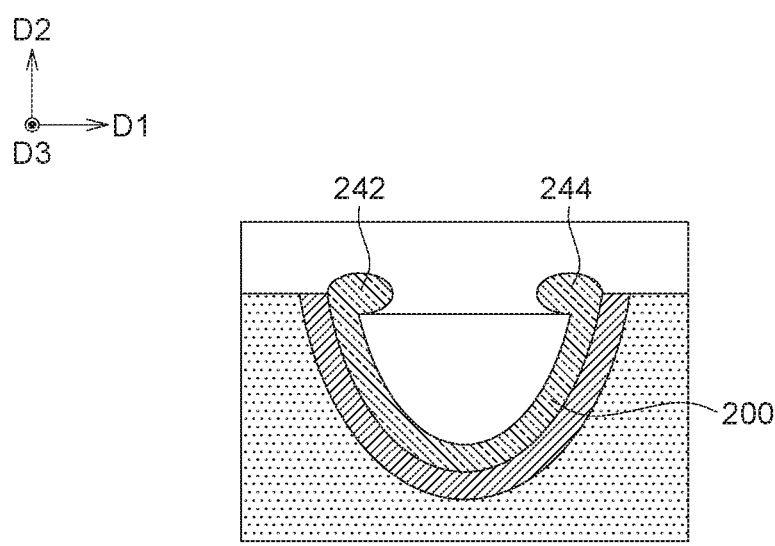
FIG. 17 illustrates a cross-section view of a memory device according to embodiments.

The source side element 242 and the drain side element 244 formed by an epitaxial method described with referring to FIG. 7A and FIG. 7B are not limited to the profile as shown in FIG. 7B. The source side element 242 and the drain side element 244 may have other kinds of profiles (for example, as shown in FIG. 16 and FIG. 17), which may be varied according to the selected epitaxial process parameters. The present disclosure concept contains any profile of the source side element 242 and the drain side element 244 formed or grown from the surface of the channel element 200 with an epitaxial method.

According to the foregoing disclosure, the memory device of embodiments can have an increased memory cell array density.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A memory device, comprising:
a first channel element and a second channel element each having an open ring shape, wherein opposing ends of the first channel element have a first convex curved sidewall surface and a second convex curved sidewall surface respectively, opposing ends of the second channel element have a third convex curved sidewall surface and a fourth convex curved sidewall surface respectively, wherein the opposing ends of the first channel element have a source side element and a drain side element respectively, a portion of the first channel element between the source side element and the drain side element has a size smaller than a size of the source side element, the size of the first channel element is smaller than a size of the drain side element;
an insulating layer disposed between the first convex curved sidewall surface of the first channel element and the third convex curved sidewall surface of the second channel element, and disposed between the second convex curved sidewall surface of the first channel element and the fourth convex curved sidewall surface of the second channel element, wherein the first channel element is insulated from the second channel element by the insulating layer;
a first memory element and a second memory element; and
a first electrode element and a second electrode element, wherein a first memory cell is defined in the first memory element between the first channel element and the first electrode element, and a second memory cell is defined in the second memory element between the second channel element and the second electrode element.

2. The memory device according to claim 1, wherein the first channel element has a concave curved sidewall channel surface and a convex curved sidewall channel surface opposing to the concave curved sidewall channel surface, wherein the convex curved sidewall channel surface is opposing to the first convex curved sidewall surface and the second convex curved sidewall surface of the first channel element.

3. The memory device according to claim 1, further comprising:
an insulating element having a convex curved sidewall insulating surface and a plane sidewall insulating surface adjacent to each other;
wherein the source side element has the first convex curved sidewall surface, the drain side element has the second convex curved sidewall surface, the first channel element is adjacent to the convex curved sidewall insulating surface, the source side element and the drain side element are extended beyond the plane sidewall insulating surface.

4. The memory device according to claim 3, wherein the source side element and the drain side element are on the plane sidewall insulating surface of the insulating element.

5. The memory device according to claim 1, wherein the source side element and the drain side element have a conductivity larger than a conductivity of the portion of the first channel element between the source side element and the drain side element.

6. The memory device according to claim 1, wherein the source side element has the first convex curved sidewall surface, the drain side element has the second convex curved sidewall surface, the source side element, the drain side element and the portion of the first channel element between the source side element and the drain side element comprise single crystal silicon or polysilicon.

7. The memory device according to claim 6, further comprising a metal silicide layer on the first convex curved sidewall surface of the source side element and on the second convex curved sidewall surface of the drain side element.

8. The memory device according to claim 1, wherein the first memory element comprises a concave curved sidewall memory surface, a convex curved sidewall memory surface, and a sidewall memory plane between the concave curved sidewall memory surface and the convex curved sidewall memory surface, wherein the first channel element is adjacent to the concave curved sidewall memory surface.

9. The memory device according to claim 1, wherein the first memory element comprises a concave curved sidewall memory surface, a convex curved sidewall memory surface, and a sidewall memory plane between the concave curved sidewall memory surface and the convex curved sidewall memory surface, the first electrode element has a sidewall electrode surface coplanar with the sidewall memory plane of the first memory element.

10. The memory device according to claim 1, comprising a plurality of the first electrode elements disposed on a sidewall surface of the first memory element along a vertical direction and separated from each other, wherein a plurality of the first memory cells is defined in the first memory element between the first channel element and the plurality of the first electrode elements.

11. The memory device according to claim 1, further comprising:
an insulating element between the insulating layer and the first channel element.

12. The memory device according to claim 1,
wherein the first memory element has an open ring shape.

13. The memory device according to claim 12, wherein the first memory element comprises a concave curved sidewall memory surface and a convex curved sidewall memory surface opposing to the concave curved sidewall memory surface.

14. The memory device according to claim 13, wherein the first memory element further comprises a sidewall memory plane between the concave curved sidewall memory surface and the convex curved sidewall memory surface.

15. The memory device according to claim 14, wherein the sidewall memory plane is coplanar with a sidewall electrode surface of the first electrode element.

16. The memory device according to claim 13, wherein the first channel element is on the concave curved sidewall memory surface, the first electrode element is on the convex curved sidewall memory surface.

17. The memory device according to claim 12, wherein the source side element has the first convex curved sidewall surface, the drain side element has the second convex curved sidewall surface, the portion of the first channel element between the source side element and the drain side element has a convex curved sidewall channel surface opposing to the first convex curved sidewall surface and the second convex curved sidewall surface.

* * * * *